US010720468B2

(12) United States Patent
Hughes et al.

(10) Patent No.: US 10,720,468 B2
(45) Date of Patent: Jul. 21, 2020

(54) REDUNDANCY IN INORGANIC LIGHT EMITTING DIODE DISPLAYS

(71) Applicant: Facebook Technologies, LLC, Menlo Park, CA (US)

(72) Inventors: Patrick Joseph Hughes, Cork (IE); Vincent Brennan, Cork (IE); Joseph O'Keeffe, Fermoy (IE); Christopher Percival, Blarney (IE); William Padraic Henry, Cork (IE); Tilman Zehender, Cork (IE)

(73) Assignee: Facebook Technologies, LLC, Menlo Park, CA (US)

( * ) Notice: Subject to any disclaimer, the term of this patent is extended or adjusted under 35 U.S.C. 154(b) by 0 days.

(21) Appl. No.: 16/158,237

(22) Filed: Oct. 11, 2018

(65) Prior Publication Data

US 2019/0043917 A1    Feb. 7, 2019

Related U.S. Application Data

(62) Division of application No. 15/351,235, filed on Nov. 14, 2016, now Pat. No. 10,177,196.

(30) Foreign Application Priority Data

Nov. 17, 2015  (GB) .................................. 1520265.8

(51) Int. Cl.
*H01L 27/15*    (2006.01)
*H01L 33/00*    (2010.01)
(Continued)

(52) U.S. Cl.
CPC ............ *H01L 27/156* (2013.01); *H01L 22/14* (2013.01); *H01L 25/167* (2013.01);
(Continued)

(58) Field of Classification Search
CPC ............... H01L 27/156; H01L 27/1218; H01L 33/0095; H01L 33/486; H01L 25/167;
(Continued)

(56) References Cited

U.S. PATENT DOCUMENTS 7,462,897 B2    12/2008  Endo
7,545,352 B2    6/2009   Kwak et al.
(Continued)

FOREIGN PATENT DOCUMENTS

CN    102915703 B    2/2013
CN    105023522 A    11/2015
(Continued)

OTHER PUBLICATIONS

GB Combined Search and Examination Report, GB Application No. 1607248.0, dated Oct. 26, 2016, 7 pages.
(Continued)

*Primary Examiner* — Kyoung Lee
*Assistant Examiner* — Christina A Sylvia
(74) *Attorney, Agent, or Firm* — Fenwick & West LLP

(57) ABSTRACT

Methods and apparatus for use in the manufacture of a display device including pixels. Each pixel includes a plurality of sub-pixels, each sub-pixel configured to provide light of a given wavelength. The method may include: performing, using a pick up tool (PUT), a first placement cycle comprising picking up first light emitting diode (LED) dies, and placing a first LED die on a substrate of the display device at a location corresponding to a sub-pixel the display device. The method further includes performing one or more subsequent placement cycles comprising picking up a second LED die, and placing the second LED die on the substrate of the display device at a second location corresponding to the sub-pixel of the display device. Multiple first and second LED dies may be picked and placed during each
(Continued)

placement cycle to populate each pixel of the display device to provide redundancy of LED dies at each sub-pixel.

16 Claims, 8 Drawing Sheets

(51) Int. Cl.

| | |
|---|---|
| *H01L 21/66* | (2006.01) |
| *H01L 25/16* | (2006.01) |
| *H01L 27/12* | (2006.01) |
| *H01L 33/48* | (2010.01) |
| *H01L 25/075* | (2006.01) |

(52) U.S. Cl.
CPC ...... *H01L 27/1218* (2013.01); *H01L 33/0095* (2013.01); *H01L 33/486* (2013.01); *H01L 25/0753* (2013.01); *H01L 2933/0033* (2013.01)

(58) Field of Classification Search
CPC ............... H01L 25/0753; H01L 22/14; H01L 2933/0033
See application file for complete search history.

(56) References Cited

U.S. PATENT DOCUMENTS

| | | | |
|---|---|---|---|
| 7,760,165 B2 | 7/2010 | Cok | |
| 7,808,460 B2 | 10/2010 | Nakajima | |
| 7,893,610 B2 | 2/2011 | Lee et al. | |
| 8,426,227 B1 | 4/2013 | Bibl et al. | |
| 9,099,665 B2 | 8/2015 | Suganuma et al. | |
| 9,276,224 B2 | 3/2016 | Yamazaki et al. | |
| 9,468,050 B1 | 10/2016 | Rotzoll et al. | |
| 9,570,532 B2 | 2/2017 | Huangfu et al. | |
| 9,754,538 B2 | 9/2017 | Lee et al. | |
| 2003/0011377 A1* | 1/2003 | Oohata | G09G 3/006 324/512 |
| 2005/0127376 A1* | 6/2005 | Young | H01L 27/3225 257/80 |
| 2005/0231459 A1 | 10/2005 | Furukawa | |
| 2005/0233504 A1 | 10/2005 | Doi et al. | |
| 2006/0022909 A1 | 2/2006 | Kwak et al. | |
| 2006/0169993 A1* | 8/2006 | Fan | H01L 27/153 257/88 |
| 2006/0197722 A1 | 9/2006 | Nakajima | |
| 2007/0029554 A1 | 2/2007 | Nakamura et al. | |
| 2008/0074356 A1 | 3/2008 | Cok | |
| 2008/0277677 A1 | 11/2008 | Kuo et al. | |
| 2009/0066617 A1 | 3/2009 | Chang et al. | |
| 2010/0134018 A1 | 6/2010 | Tziony et al. | |
| 2011/0149571 A1 | 6/2011 | Lin | |
| 2012/0223875 A1* | 9/2012 | Lau | G09G 3/32 345/83 |
| 2013/0201321 A1 | 8/2013 | Chao et al. | |
| 2014/0159067 A1 | 6/2014 | Sakariya et al. | |
| 2014/0167011 A1 | 6/2014 | Huangfu et al. | |
| 2014/0267683 A1 | 9/2014 | Bibl et al. | |
| 2014/0319486 A1 | 10/2014 | Hong | |
| 2014/0354286 A1 | 12/2014 | Kim | |
| 2014/0361322 A1* | 12/2014 | Gong | H01L 27/156 257/91 |
| 2015/0054542 A1 | 2/2015 | Song | |
| 2015/0076528 A1 | 3/2015 | Chan et al. | |
| 2015/0371585 A1 | 12/2015 | Bower et al. | |
| 2016/0005383 A1 | 1/2016 | Lee et al. | |
| 2016/0020130 A1 | 1/2016 | Bower et al. | |
| 2016/0351092 A1 | 12/2016 | Chen et al. | |
| 2017/0025075 A1 | 1/2017 | Cok et al. | |
| 2017/0047393 A1 | 2/2017 | Bower et al. | |
| 2017/0179356 A1 | 6/2017 | Rogers et al. | |
| 2017/0301296 A1 | 10/2017 | Pappas et al. | |
| 2017/0309224 A1 | 10/2017 | Pappas et al. | |
| 2017/0372677 A1 | 12/2017 | Chang et al. | |
| 2019/0004105 A1* | 1/2019 | Henley | H01L 33/62 |
| 2019/0181060 A1 | 6/2019 | Pappas et al. | |

FOREIGN PATENT DOCUMENTS

| | | |
|---|---|---|
| EP | 1615195 A | 1/2006 |
| JP | H08137413 | 5/1996 |
| JP | 2010-060803 A | 3/2010 |
| JP | 2010-152223 A | 7/2010 |
| WO | WO 2016/062835 A1 | 4/2016 |

OTHER PUBLICATIONS

GB Further Search Report, GB Application No. 1607248.0, dated Feb. 7, 2018, 1 page.
PCT International Search Report and Written Opinion, PCT Application No. PCT/GB2016/052722, dated Dec. 16, 2016, 12 pages.
PCT International Search Report and Written Opinion, PCT Application No. PCT/US2017/029418, dated Jul. 24, 2017, 14 pages.
United States Office Action, U.S. Appl. No. 15/351,235, dated Dec. 14, 2017, 14 pages.
Extended European Search Report, European Application No. 18188965.0, dated Dec. 11, 2018, 5 pages.
Intellectual Property Office of the United Kingdom, Office Action, British Application No. GB1515564.1, dated Feb. 20, 2019, 3 pages.
Japan Patent Office, Office Action, Japanese Application No. 2018-555877, dated Apr. 2, 2019, 4 pages.
Extended European Search Report, European Application No. 17790269.9, dated Jul. 3, 2019, 13 pages.
United States Office Action, U.S. Appl. No. 15/753,959, dated Jul. 15, 2019, 17 pages.

\* cited by examiner

REDUNDANCY IN INORGANIC LIGHT EMITTING DIODE DISPLAYS

CROSS REFERENCE TO RELATED APPLICATION

This application is a division of U.S. patent application Ser. No. 15/351,235, filed Nov. 14, 2016, which claims the benefit of priority from United Kingdom Patent Application No. 1520265.8, titled "Redundancy in Inorganic Light Emitting Diode Displays," filed Nov. 17, 2015, which is incorporated herein by reference in its entirety.

TECHNICAL FIELD

The invention relates to LED dies for display technologies, and displays and methods of manufacture for displays. Specifically, the invention is related to, but need not be limited to, micro-LED (µLED) dies for display technologies, µLED displays and methods of manufacture for µLED displays.

BACKGROUND

Displays are ubiquitous and are a core component of wearable devices, smart phones, tablets, laptops, desktops, TVs and display systems. Common display technologies today range from Liquid Crystal Displays (LCDs) to more recent Organic Light Emitting Diode (OLED) Displays.

The display architectures include passive and active matrix displays depending on whether each pixel is driven separately or not. Active drive circuitry uses thin film transistor technology (TFT) where transistors based on amorphous oxide or polysilicon technology are manufactured on glass panels which may have glass substrate sizes from first generation displays of around 30 cm×40 cm to the latest tenth generation displays (known as GEN10) of around 2.88 m×3.15 m.

In most portable devices (i.e. battery powered devices) the display uses a majority of the available battery power. Additionally, the most common user complaint for portable devices is insufficient display brightness. To extend battery life and improve brightness levels it is desirable to reduce power consumption and produce higher luminance emission from the light source.

SUMMARY

Some embodiments include a method for manufacturing a display device or element comprising pixels, each pixel comprising a sub-pixels, each sub-pixel configured to provide light of a given wavelength. The method may include: performing, using a pick up tool (PUT), a first placement cycle, and then one or more additional placement cycles. In multiple placement cycles, multiple LED dies (e.g. emitting light at a wavelength) can be placed at the same sub-pixel. The first placement cycle may include picking up first LED dies, and placing the first LED dies on a substrate of the display device at locations corresponding to the pixels of the display device. The first LED dies may include a first LED die including at least one LED emitter that is placed at a location corresponding to a sub-pixel of a pixel.

The method may further include, performing, using the PUT, one or more subsequent placement cycles. A subsequent placement cycle may include picking up second LED dies, and placing the second LED dies on the substrate of the display device at the locations corresponding to the pixels of the display device. The second LED dies may include a second LED die including at least one LED emitter that is placed at a second location corresponding to the sub-pixel of the pixel.

In some embodiments, the method comprises determining a number of subsequent placement cycles based on a model.

In some embodiments, the model defines the number of subsequent placement cycles based on predicted device yields of a fabrication process for the first LED dies.

In some embodiments, the model defines the number of subsequent placement cycles based on one or more of: a quality of semiconductor used to fabricate the first LED dies; or the fabrication process used to fabricate the first LED dies.

In some embodiments, the model defines the number of subsequent placement cycles to achieve a predetermined display yield.

In some embodiments, the method further comprises performing a test of the at least one LED emitter of the first LED die to determine whether the at least one LED emitter is functional.

In some embodiments, the method further comprises determining a number of subsequent placement cycles based on a result of the test.

In some embodiments, the method further comprises repairing or replacing a non-functional LED die based on a result of the test.

In some embodiments, the test comprises applying a reverse bias to the at least one LED emitter of the first LED dies.

In some embodiments, the first placement cycle comprises picking up a first array of the first LED dies, and wherein the first LED dies of the first array are arranged on the PUT to correspond with the locations corresponding to the pixels of the display device.

In some embodiments, the subsequent placement cycle comprise picking up a second array of the second LED dies, and wherein the second array is of equal size to the first array.

In some embodiments, the method further comprises rendering the at least one LED emitter of the first LED die non-functional.

In some embodiments, one of first LED die or the second LED die is configured to emit light.

In some embodiments, the other one of the first LED die or the second LED is configured to operate as a photo-diode for generating electrical current when light is incident thereon.

In some embodiments, the method further comprises using the electrical current to charge a battery, such as the battery of a device that includes the display device.

In some embodiments, the first and second LED dies comprise µLED dies, the µLED dies each including one or more µLED emitters.

In some embodiments, each of the one or more µLED emitters of a µLED die comprises first and second electrodes configured to allow current to pass through the µLED emitter, and wherein the first and second electrodes are positioned on the same surface of the µLED die.

In some embodiments, the first and second electrodes are positioned on a surface of the µLED die opposite an emission surface.

In some embodiments, the µLED dies each include a plurality of µLED emitters, each of the plurality of µLED emitters configured to emit light of substantially the same wavelength. In some embodiments, the first and second LED dies comprise µLED dies, a µLED die including µLED emitters. Each of the μLED emitters of the μLED die includes a first electrode. The first electrodes of the μLED emitters of the μLED die are connected with a common second electrode the μLED die.

Some embodiments may include a display device, comprising: a substrate; and a micro-LED (μLED) die attached to the substrate. The μLED may include: a μLED emitter comprising: a substantially parabolic mesa structure; a light emitting source within the mesa structure; and a primary emission surface on a side of the device opposed to a top of the mesa structure. The μLED die further may include a first electrode and a second electrode positioned on a surface of the μLED die.

In some embodiments, the surface of the μLED die is opposite the emission surface.

In some embodiments, the μLED die includes a plurality of μLED emitters, wherein a first electrode of each of the plurality of μLED emitters is common to the plurality of μLED emitters In some embodiments, the display device may further include a plurality of μLED dies attached to the substrate at locations corresponding to a sub-pixel of a pixel of the display device.

According to an aspect of the invention, there is provided a computer program comprising instructions which, when executed on at least one processor, configures the at least one processor to perform functionalities as described herein.

According to an aspect of the invention, there is provided a carrier containing a computer program disclosed herein, wherein the carrier is one of an electronic signal, optical signal, radio signal, or non-transitory computer readable storage medium.

As used herein, the term LED is considered to encompass an inorganic LED (ILED). Further, the term ILED is considered to encompass a μLED.

As used herein, the term Pick up Tool (PUT) encompasses a tool containing a single pick up head or multiple pick up heads. Each head may be designed to pick at least one LED die (for example, a μLED or inorganic LED (ILED)) from a handle layer (also termed a handle carrier substrate) and place the ILED die onto a final substrate, for example a display substrate such as a TFT.

A selective PUT may be a tool containing a single pick up head or multiple pick up heads. Each head is individually controllable such that it can be enabled or disabled to pick at least one ILED die from a handle carrier substrate selectively. That is, the amount of adherence applied by a selective PUT may be altered, whereby if the pick up head is enabled then the ILED die is picked up, and if the pick up head is disabled then the ILED die is not picked up. The selective PUT may then be configured to and place a picked ILED die onto a final substrate such as a TFT. A selective PUT may therefore be considered to be programmable depending on the pick up requirements and is considered an active PUT.

A non-selective PUT may be a tool containing a single pick up head or multiple pick up heads. The non-selective PUT may be configured to apply a fixed level of adherence to any given ILED die. The level of adherence may not be changed. A non-selective PUT may be designed to pick according to a predetermined pattern or sequence. Each head of a non-selective PUT therefore cannot be individually enabled or disabled to pick a single ILED die from a handle carrier substrate and place the ILED die onto a final substrate such as a TFT. A non-selective PUT may therefore be considered as non-programmable and is considered a passive PUT.

A typical ILED Display manufacturing approach comprises two features: 1) a spatial map across the wafer (or handle carrier substrate) of Known Good Die (KGD) from a high yielding wafer, which requires wafer level testing prior to assembly; and 2) a selective PUT to pick and place KGD.

The inventors have appreciated that for an ILED display manufacture method, the combination of KGD testing at wafer source coupled with a selective PUT is a significant challenge and not readily achieved. Alternative strategies are desirable.

Disclosed herein are methods of ILED display manufacture. The methods may lead to yield improvement based on an LED redundancy schemes that take into consideration realistic μLED wafer starting yields. The methods may include the use of a non-selective PUT for pick and place assembly. The methods may include multiple assembly cycles (e.g. pick, place & test) combined with multiple μLED dies per color per display pixel, and each die containing multiple emitters to give the same effect as a starting wafer material of high device yield to give higher display yield. It is noted that a wafer's device yield relates to the number of functional devices that a wafer may produce and can be affected by a number of factors, such as wafer quality and fabrication methods. Display yield encompasses a measure of the number of functional LED emitters or μLED emitters in a display.

In exemplary methods, a single assembly station may undertake an initial assembly cycle (e.g. pick, place & test) as follows: a transfer printing non-selectable PUT picks an array of μLED dies from a handle layer. The array of μLED dies is placed on a display substrate starting, for example, at one corner. This sequence is repeated with the pick location on the handle layer moving sequentially to the next (e.g. adjacent) μLED dies and a placement location moving to the next (e.g. adjacent) set of locations on the substrate—the next square in 'a chess board pattern', by way of example. Once the sequence has moved through all the squares in the chess board pattern for one colour, the same process is repeated for the other two colors. Once all colors are completed, a test sequence undertaken (i.e. all μLED dies are turned on and functionally tested and it is determined which μLED dies and/or emitters in which pixel locations are not working. Depending on the yield, a final repair step is then implemented to repair nonworking μLED dies at pixel locations. This may involve the removal and replacement, the placement of a redundant chips and/or the deactivation of the bad chips at a repair station.

In exemplary methods, the overall target for the μLED wafer yield may be known. The multiple μLED dies per color per display pixel may be sourced from different locations of the same handle layer or from different handle layers. The sequence of pick, place & test may be repeated until there is a working μLED die of each colour (R, G and B) in all or nearly all (e.g. 99% or more) of the display pixel locations. The μLED dies may have all contacts on the same side, and the contacts may be placed down onto the glass, enabling the μLED emitters of each μLED die to be powered from the glass substrate immediately after placement. The methods may be used where the μLED wafer has not been previously tested and a defined number of μLED (single emitter or multi emitter LED) dies are placed per colour per pixel.

When a LED die comprises multiple emitters instead of a single emitter per LED die, modelling shows that such multiple emitter dies can significantly reduce the number of cycles/dies required per pixel to obtain an acceptable display yield. This can have a significant impact on wafer material used (number of dies required) and assembly time (number of assembly cycles).

In exemplary methods, there is no μLED wafer test or testing during the assembly cycle, only pick and place. The probability of each display pixel working is sufficiently high after the placement of the defined number of μLED dies per pixel that it is now possible to obtain working products (displays) with a sufficiently low numbers of defects per display product that a manufacturing line repair strategy can be deployed, i.e. the display yield is sufficiently high that it is considered a 'manufacturable' process. This approach will give an acceptably low number of defects per display product for small displays, i.e. the cost increase due to multiple dies per pixel is immaterial for displays of small pixel numbers such as wearable technologies.

In some embodiments, subsequent dies (after the first placement) are single emitter μLED dies. This will reduce the size of the μLED dies that are used and reduce the cost.

In some embodiments, testing can be introduced between each pick and place cycle using a selective PUT to pick out defective μLED die and replace with a working die from a wafer bank of KGD which has been designated for repair work.

In some embodiments, excess emitters are left enabled to act as solar cells for energy harvesting resulting in extended battery operation and lifetime.

In some embodiments, dies have p and n contacts on the same sides to enable in-process electrical testing. Known approaches use one contact up and one contact down. Testing of such dies directly after placement with this configuration cannot be a full electrical test without further back processing steps for top contact. Alternatively a different approach may be used, such a fluorescence testing of the LED.

In some embodiments, a laser is used to cut the tracks for any emitter within a die that are placed but are defective and/or for excess emitters. Multiple but different numbers of LED emitters per pixel working in parallel may create image artefacts that will not be acceptable.

A selectable PUT may also be used to repair a LED wafer or handle layer to get a 'virtual' wafer yield of 100% before submitting the wafer to the assembly processes described above.

A selectable PUT may be used to 'repair' defects on a LED wafer or handle layer to produce LED wafers or handle layers having a ~100% virtual yield. In addition to an AOI approach to inspect LEDs, such as μLEDs, (functional, optical power, beam profile) an additional approach may be used, such as reverse biasing the LED and shining light onto it, i.e. getting it to act as a photodiode, and using the behavior of the LED in photodiode mode to predict and characterize the LEDs parametric performance.

Figure 1:
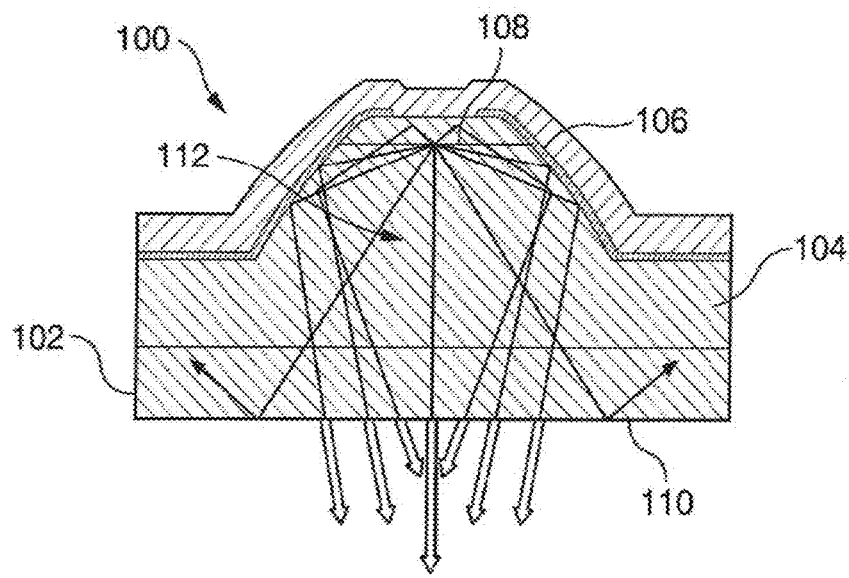
FIG. 1 is schematic cross section of a μLED, in accordance with one embodiment.

The figures depict embodiments of the present disclosure for purposes of illustration only. One skilled in the art will readily recognize from the following description that alternative embodiments of the structures and methods illustrated herein may be employed without departing from the principles, or benefits touted, of the disclosure described herein.

DETAILED DESCRIPTION

Inorganic light emitting diode (ILED) displays may provide superior battery performance and enhanced brightness. The ILED display is different from the OLED display. OLED displays pass current through organic or polymer materials that are sandwiched between two glass planes to produce light. ILED displays replace organic materials of OLEDs with a discrete standard LED die (which is made of inorganic materials) at each pixel of the display (each pixel consists of three individual Red, Green and Blue LED dies for color displays).

Standard (i.e. inorganic) LED devices have been around for many years and their performance (efficiency, brightness, reliability and lifetime) has been optimized over that time as the LED industry has pursued many commercial opportunities—especially the challenge of developing LED technology to enable it to replace the standard incandescent bulbs for general light applications, i.e. inorganic LEDs are significantly more efficient, bright and reliable than the new and less developed OLED materials.

The concept of individually switchable standard LED dies (R, G & B) at each pixel in a display is well known. This approach is in widespread use for large information displays. However, to-date it has not been possible to scale this approach down to smaller displays as it requires smaller area, for example less than 100 μm2, LED devices which are more challenging to manufacture compared to standard larger LEDs, which have a planar design, are inefficient in light direction control and are typically greater than 0.25 mm2 in area. Additionally, when using standard LEDs the assembly of the many millions of pixels needed for a laptop or smart phone display is not feasible using standard large area chips and traditional assembly/manufacturing techniques such as flip-chip.

The inventors have further appreciated some challenges with ILED display manufacture, as set out below.

State of the art LED wafer manufacturing yields vary in the industry from 60-90% depending on die size and performance parameters. Unlike the semiconductor industry, there has been no motivating market to strive to higher manufacturing yields equivalent to those of the silicon device manufacture, which may reach in excess of 98% for example.

These low yields by comparison to the silicon industry has been a primary obstacle to ILED display developments given the pixel count in displays range from 10s of thousands for wearable displays to 10s of millions for large area high resolution displays.

To compound the yield issue, the dimensions of LED dies required for ILED displays are significantly smaller in scale compared to standard LED dies for traditional luminaire/lighting applications. This difference in size can have a dramatic impact on yield when the size of the defect is similar in scale to the LED dies. This represents another significant barrier which must be overcome to manufacture an ILED image generator.

High LED wafer yields greater than or equal to 99.99% are ideally required as an input to an ILED display manufacture process because the display industry takes a zero tolerance approach to pixel defects in a display. These LED wafer yield requirements for displays are unrealistic by today's standards, but with the correct investment, LED wafer yields for ILED displays greater than 90% are considered realistic.

Assembly methodologies may be factored in to the manufacturing process of LED display generators to overcome low LED wafer yields. This can make the production of ILED displays acceptable to the display industry.

One approach to overcoming ILED yield problems is to pre-process (repair) an ILED wafer before using it in an ILED display assembly process. In such pre-processing techniques, any defective ILED dies are removed from a wafer after manufacture and before assembly of a display driver. The removal of defective ILED dies may be done using a Known Good Die (KGD) map generated from pretesting of the ILED wafer, which can be difficult. Defective ILED dies are removed from the ILED wafer. KGDs from a further ILED wafer are then picked from the further wafer and placed in the locations on the ILED wafer from which the defective ILED dies were removed. It is then possible to present wafers of a notional 100% yield to an ILED display assembly station/process. This is a known process in the Silicon Semiconductor Industry but is considered another challenge here because of the need for a Selective Pick up Tool (PUT) to enable the efficient implementation of this wafer repair strategy. A typical approach to implementing such a wafer repair strategy would be to use a normal PUT (single die pick up tool) to pick up, individually and sequentially, good dies and replace each bad die on the ILED wafer. An exemplary method disclosed herein is to use a PUT with a matrix/array of pick locations to implement a repair process on a massively parallel scale. In such methods, the positions should to be determined in the matrix/array of pick locations on the PUT that need to pick an ILED die during both cycles of the repair process (i.e. the removal of defective dies from the original wafer and the picking of replacement dies from the further wafer). That is, a selectable PUT is used which is not readily achieved.

It is difficult and possibly not viable to test individually each die on an ILED wafer. The following methods are proposed below to achieve a realistic high yielding ILED display manufacturing strategy.

Typically, LED wafers are tested at the end of the wafer manufacturing process in a LED wafer fab. Additionally, the traditional silicon integrated circuit fabrication model is wafer level test directly post front end processing. This allows devices to be inked/binned and sorted into segmented carriers or trays according to the performance requirements of the application. Typically these devices (LEDs or ICs) have dimensions greater than 0.5 mm to 3 mm on one side. Wafer testing is carried out using automated wafer test stations where devices are individually probed to test electrical and optical characteristics. KGD maps are generated by this process.

In the approach discussed herein for ILED displays, the ILED dies are ~5 µm to 20 10 µm in size. This means that there will be ~100 million dies on a single 4" wafer. Given the quantity of devices to be tested and their size, wafer testing represents a significant challenge and the economics or practicalities of achieving a normal 100% die test on a wafer is not possible today. Alternative smart wafer test approaches have been considered. These include fluorescent imaging of each die on a wafer. However, it is not clear that, at the die sizes involved, the resolution is sufficient to determine an accurate KGD from its nearest failing neighbors.

Automated Optical Inspection (AOI) is a powerful tool commonly used as part of an integrated test strategy that ensures costs are kept low by detecting or screening out defects at various stages in a manufacturing cycle. AOI can be introduced early in the process to catch defects in the production process, in particular if faults cost greater to repair further down the assembly flow. Alternatively, AOI can be introduced at critical assembly steps to avoid costly repairs. Typical AOI systems are capable of inspection to sizes down to 10 µm to 15 µm resolution. Higher resolution means a slower speed of inspection so the resolution choice is dependent on a best fit to the production process based on the component size and cycle time.

For ILED displays, AOI screening may be used to detect if ILED dies are present or not after placement on a glass substrate/flat panel. Exemplary ILED displays include ILEDs with two contacts down onto the substrate/flat panel. It is therefore possible to determine using AOI the assembly placement yield by detecting an optical contrast where devices have not been placed.

Liquid crystal display (LCD) and flat panel display repair products and strategies exist and are well suited for isolating circuits, removing top-layer metal and dielectrics passivation layers on semiconductor devices. Repair, however, is generally avoided as it can be slow and costly. Typically, a repair process can be tolerated at an early stage adoption of new technology while it commands a premium but eventually, as the manufacturing yields improve, repair is undesirable.

Methods for repair include laser trimming of microelectronics components to cut tracks or fuse circuitry. This can be used to create an open circuit device for example.

The inventors have appreciated that for ILED displays to become more commercially viable, one or more of the above challenges should be solved. A manufacturing methodology is disclosed herein, which is tailored to the specific needs of the ILED display industry by overcoming one or more shortfalls in existing technologies for complicated wafer test methods and selective PUT tool design. For example, exemplary methods and apparatus comprise a redundancy scheme deployed using the unique properties of micro LEDs (µLEDs) for display products ranging from wearable to larger laptop displays.

Generally, disclosed herein is a method for manufacture of displays. Exemplary displays may be used in display applications such as wearable display incorporating µLEDs.

As used herein, "µLED" technology encompasses micron size ILED devices that directionalize the light output and maximize the brightness level observed by the user. A μLED is disclosed in U.S. Pat. No. 7,518,149 that effectively delivers directionalized light. As used herein, "directionalized light" encompasses collimated and quasi-collimated light. For example, directionalized light may be light that is emitted from a light generating region of an ILED and at least a portion of the emitted light is directed into a beam having a half angle. This may increase the brightness of the ILED in the direction of the beam of light.

A μLED may have a circular cross section, in which case a diameter of the μLED is typically less 20 μm. A μLED may have a parabolic structure etched directly onto the ILED die during the wafer processing steps. The parabolic structure may comprise a light emitting region of the μLED and reflects a portion of the generated light to form a quasi-collimated light beam emerging from the chip.

FIG. 1 shows an exemplary μLED 100. The μLED 100 is the same or similar to the μLED having high extraction efficiency and outputting quasi-collimated light because of a parabolic shape as discussed in U.S. Pat. No. 7,518,149. A substrate 102 has a semiconductor epitaxial layer 104 located on it. The epitaxial layer 104 is shaped into a mesa 106. An active (or light emitting) layer 108 is enclosed in the mesa structure 106. The mesa 106 has a truncated top, on a side opposed to a light transmitting or emitting face 110 of the μLED 100. The mesa 106 also has a near-parabolic shape to form a reflective enclosure for light generated within the μLED 100. The arrows 112 show how light emitted from the active layer 108 is reflected off the internal walls of the mesa 106 toward the light exiting surface 110 at an angle sufficient for it to escape the μLED device 100 (i.e. within an angle of total internal reflection).

The parabolic shaped structure of the μLED 100 results in a significant increase in the extraction efficiency of the μLED 100 into low illumination angles when compared to unshaped or standard LEDs.

FIGS. 2a and 2b show an exemplary μLED die 200. FIG. 2a shows a plan view and FIG. 2b shows a cross section. The die 200 comprises a single emitter 202 with a "p" electrode 204 and an "n" electrode 206 formed on the same side of the die 200 as a mesa 208. The light is output from a light emitting surface 210 on the opposite side of the μLED die 200 to the electrodes. The light is emitted through the epitaxial layer of the μLED die 200.

Figure 3:
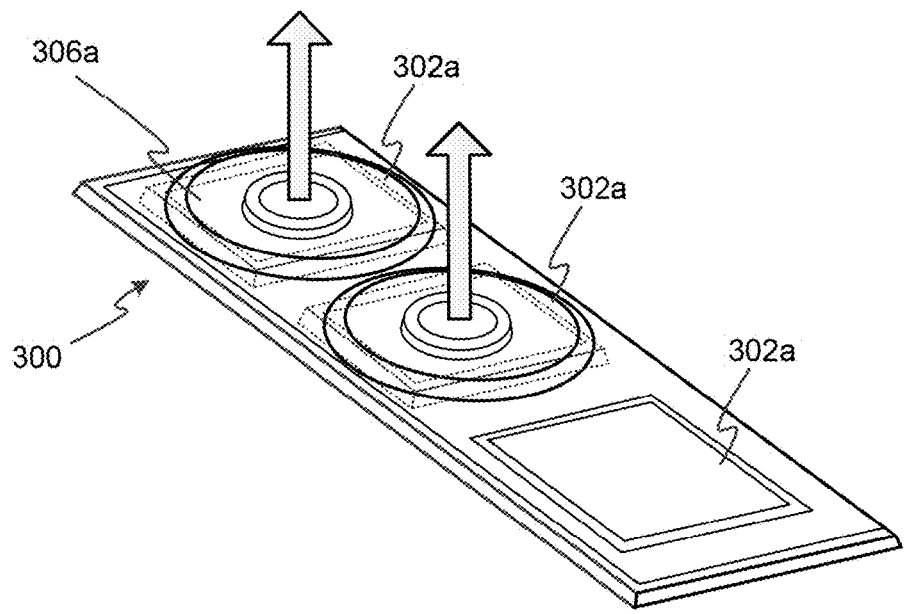
FIG. 3 is a schematic view of an exemplary μLED die, in accordance with one embodiment.

FIG. 3 shows a perspective view of a μLED die 300 comprising a plurality of emitters 302a and 302b. The single die 300 of FIG. 3 comprises two μLEDs. As used herein, the term "single die" encompasses a single and discrete section of substrate, e.g. a semiconductor substrate, on which semiconductor devices are fabricated. The die 300 comprises an n electrode 304, and a p electrode for each μLED emitter, such as the p electrodes 306a and 306b for the μLED emitter 302a and 302b, respectively.

Figure 2:
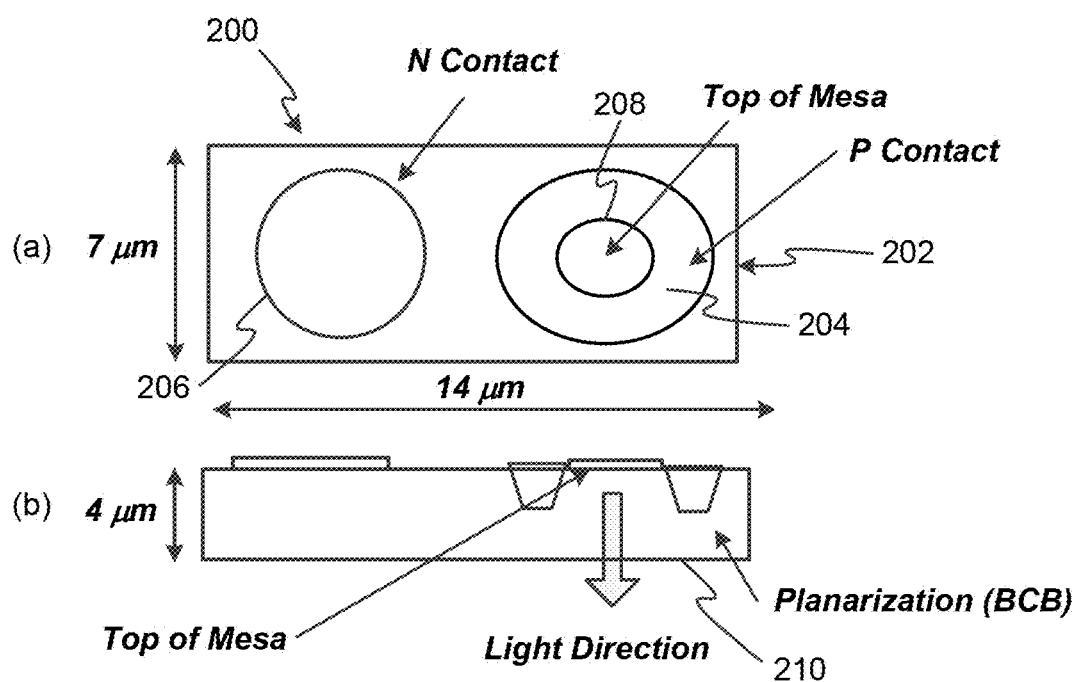
FIG. 2 is a schematic view of an exemplary μLED die, in accordance with one embodiment.

The size of the μLED die 300 is larger than the die 200 shown in FIG. 2, as the number of μLED emitters is increased. However, in the case where multiple emitters are required and the n and p electrode formations are on the same side of the chip, the real estate used by the die 300 is reduced. For example, if two emitters are required, the die 300 represents a real estate saving in excess of 25% compared to two dies 200, which comprise a single emitter.

An advantage of apparatus disclosed herein is the interconnect configuration of the dies (i.e. p and n electrodes on an opposite side to the light emitting side). This configuration allows integrated testing of the dies 300 immediately after assembly onto a glass (or other transparent material) panel and before completion of a final display stack assembly. The manufacturing test and repair strategy is therefore simplified and testing can be integrated into the assembly process.

Figure 4:
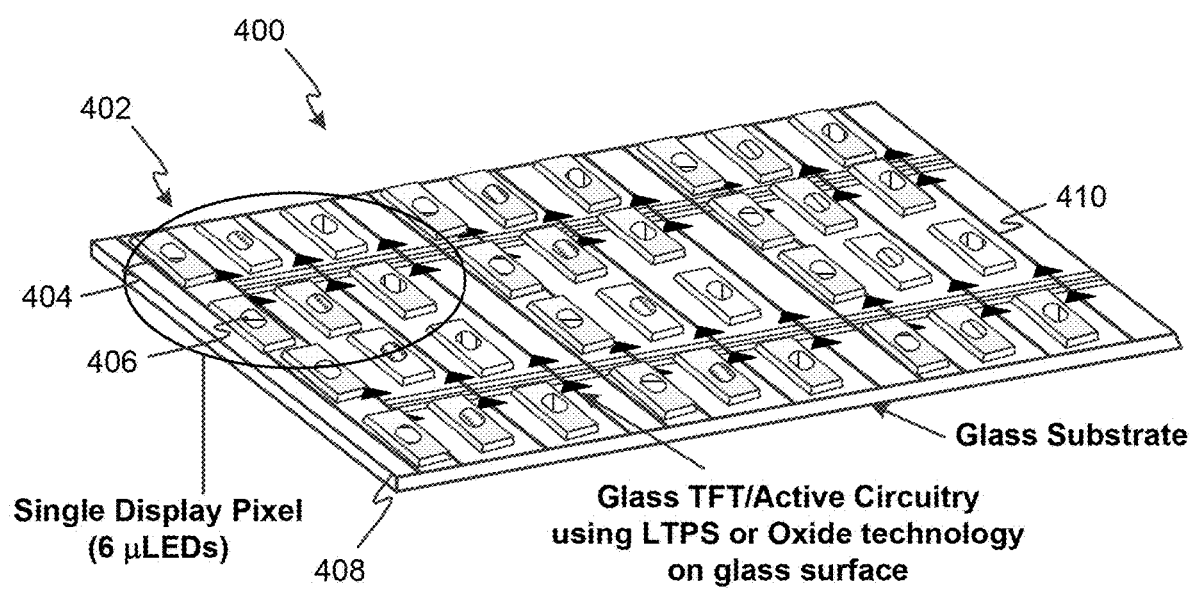
FIG. 4 is a schematic view of an exemplary display device, in accordance with one embodiment.

FIG. 4 is a schematic perspective view of a portion of a μLED display 400. The display 400 comprises a 2×3 matrix of display pixels 402. Each display pixel 402 comprises six μLED dies 404. Each die 404 comprises a single μLED emitter 406 and each display pixel 402 includes two each of Red, Green and Blue μLED emitters. The dies 404 are assembled onto a TFT glass panel substrate 408. Electrical tracks 410 are formed on the glass substrate 408 connecting to the p and n electrodes of each of the μLED dies 404, which are located on the same side of the dies 404 opposite a light emitting surface of the dies 404. In other exemplary displays, one of the p and n electrodes may be on a bottom surface of the glass panel (with the TFT circuitry) and the other of the p and n electrodes may be on a top surface of the μLED die 404.

In the exemplary display 400 of FIG. 4, redundancy is provided in each display pixel 402 by including two single dies 404 per color. A plurality of bonding sites is available per display pixel 402 (in this case two bonding sites per color of emitter) which allows, in this example, two dies per color to be mounted (i.e. each die 404 has a single emitter 406).

After the first assembly cycle an integrated test (such as AOI—as described above) may be undertaken to detect defective μLEDs, missing μLEDs and contaminated μLEDs. Such defects may be termed "killer defects".

In the example of FIG. 4, six μLED dies form a display pixel (i.e. 2 dies per color). The dies are typically mounted over multiple placement cycles.

Figure 5:
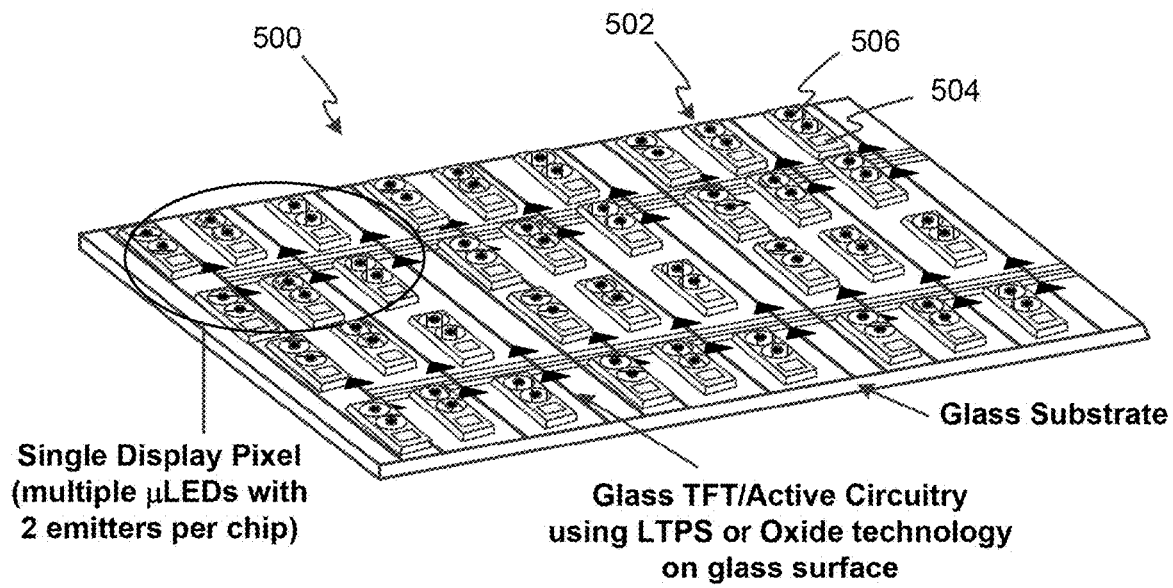
FIG. 5 is a schematic view of an exemplary display device, in accordance with one embodiment.

FIG. 5 is a schematic perspective view of a portion of a μLED display 500. In the exemplary display 500, each pixel 502 comprises a plurality of μLED dies 504 and each μLED die 504 comprises a plurality of μLED emitters 506.

Figure 6:
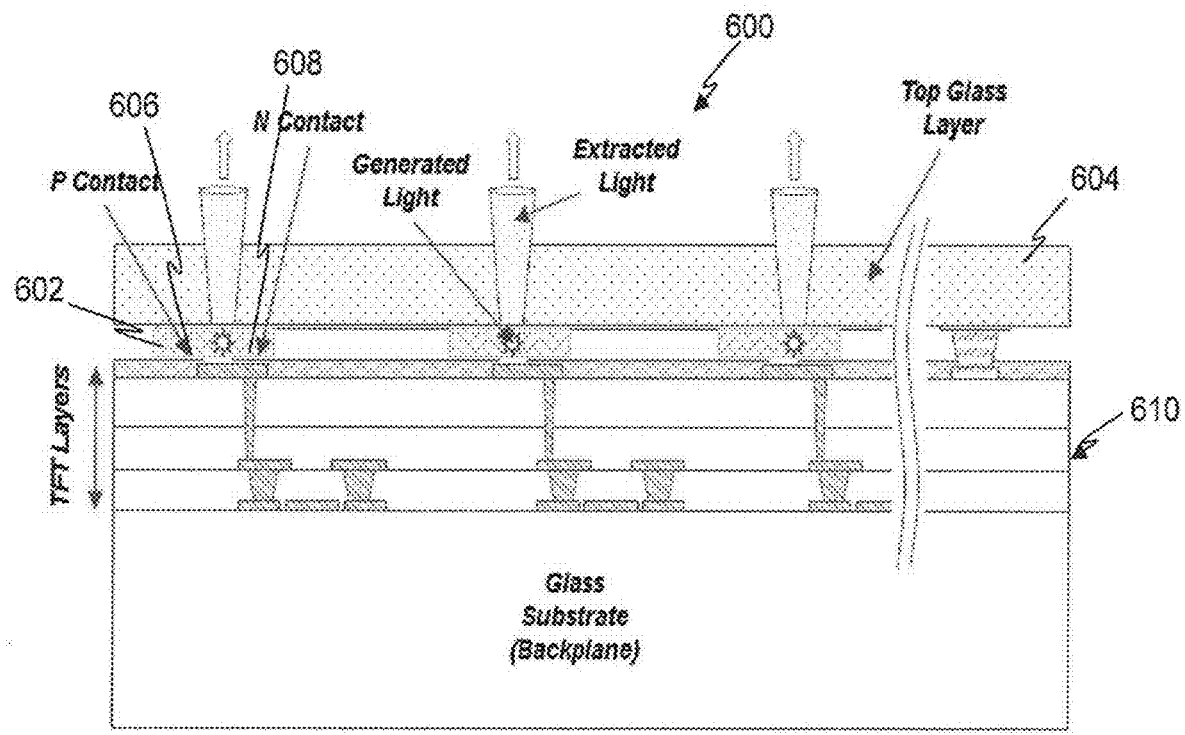
FIG. 6 is a section through an exemplary display device, in accordance with one embodiment.

FIG. 6 is a cross section through a portion of a display 600. The display 600 comprises a plurality of μLED dies 602 mounted on a glass top layer 604 such that emission of light is into and through the glass top layer 604. In the exemplary configuration of FIG. 6, both the p electrodes 606 and the n electrodes 608 are mounted on the same side of each die 602 and on an opposite face of the die 602 to the output face. FIG. 6 shows how the μLED dies 602 may be mounted on TFT layers 610 of the display 600.

The p electrodes 606 and the n electrodes 608 are on a lower surface of the dies 602 facing down and in direct contact with display active circuitry in the TFT layers 610 using suitable bonding layers. Further, the display does not require patterned bank structures that, in other displays, are used to form conductive tracks and reflective layers to directionalize light upwards towards the top glass layer 604. The display 600 comprises a plurality of μLED dies 602 that inherently directionalize light output so reflective bank layers are not necessary. In other arrangements, the contacts of the μLED dies 602 may be formed on opposite sides of the die. This restricts final testing until topside passivation and full electrical interconnections are made. In exemplary methods and apparatus disclosed herein, the two contacts 606 and 608 are facing down onto the TFT layers 610, which enables testing prior to any final passivation in the display final assembly.

An overview of the traditional AOI approach to screen assembly failure is described above. In exemplary methods and apparatus disclosed herein, it is envisaged that a test is applied whereby each μLED emitter is powered up (i.e. current is applied across the electrodes of each μLED emitter) and the AOI is used to check that the μLED is functional (i.e. light is emitted when current is applied to the μLED emitter). In an extended method of an AOI test, the individual μLED emitter's optical intensity can be measured and checked to ensure it is above a threshold required for a specified current. The optical beam profile for each μLED may also be determined using a 'camera.' This may depend on the distance of the 'camera' from the μLED and may additionally use appropriate optics.

An alternative or complementary approach to testing the μLED is also disclosed in which each μLED emitter is reverse biased such that it acts as a photodiode. The electrical response of the diode is then determined when a light beam is incident upon it. In this approach, a reverse leakage behavior will indicate whether the device is functional and may also indicate the likely parametric performance of the μLED die.

The AOI and reverse bias test approaches are termed "intermediate test" as they are tests that are carried out during each assembly cycle. This is as opposed to "source test" for frontend wafer level and "final test" at final functional assembly.

Figure 7:
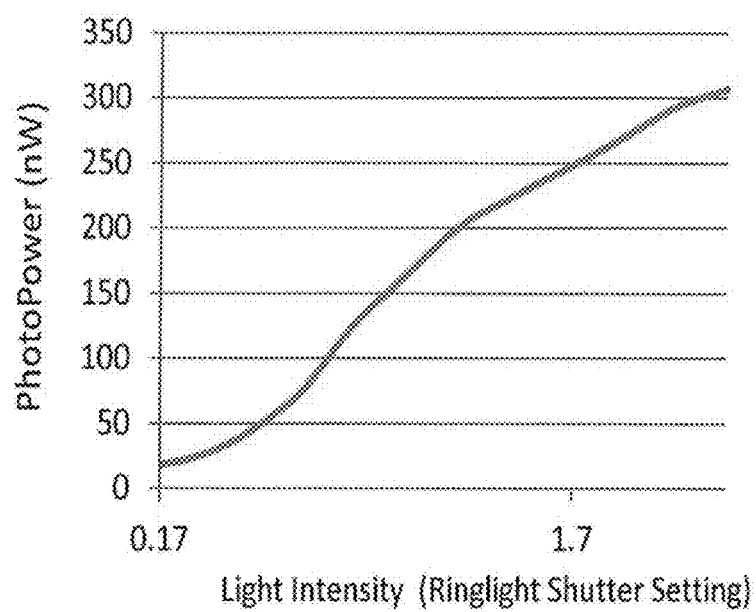
FIG. 7 is a plot of light intensity against photopower, in accordance with one embodiment.

FIG. 7 shows a plot of the light response in Nano Watts of a μLED in an arbitrary reverse bias setting for varying light intensities using a white light stereoscope ring-light with shutter settings to control the light intensity. In the exemplary measurement of FIG. 7 the reverse bias was 0.1V. FIG. 7 highlights that while the diode characteristics of the μLED are not typical, it nevertheless demonstrates excellent sensitivity to determine an electrical signature via the active circuitry for the presence of a die. Additionally, a known predictable behavior of the ILED chip at a set reverse bias operating point(s) can also provide qualitative information as to the diode characteristics of the device and therefore the likely device performance.

In an exemplary manufacturing process, a first single μLED die will be mounted onto a glass substrate in a specific display pixel location in a single placement cycle. The first μLED die may be mounted at the same time as a plurality of μLED dies at other display pixel locations in the same placement cycle. An intermediate test can then be used to determine if the first μLED die (and optionally the other μLED dies placed in the same cycle) is functional. If it is not functional a second placement cycle will place a second μLED die in the same pixel location. Again, the second μLED die may be placed at the same time as a plurality of other μLED dies placed at other pixel locations where there is no functional μLED die. This methodology can be extended and multiple placement cycles can be used to place additional μLED dies in pixel locations where there is still not a functional μLED. The above method is possible using a non-selectable PUT. Once the process is complete for one of the red, green or blue sub-pixels of a pixel, it is repeated for the other two μLED colors, noting that each display pixel location requires, red, green and blue μLEDs.

Another exemplary manufacturing process may be used that does not employ a selectable PUT. In such exemplary methods, each additional placement cycle will place a plurality of μLED dies in a plurality of display pixel locations independent of whether previous μLEDs were functional or not. If there is no selectable PUT, there is no way to prohibit the picking of μLED dies from a wafer, or the placing of those μLED dies in each display pixel location on the glass substrate. A possible disadvantage of such methods is increased cost due to multiple μLED dies in every display pixel location. However, advantages may include the removal of the need for testing of μLED dies and that such methods are possible when a selective PUT is not available.

The number of placement cycles in such methods may be determined by one or both of the following: (1) the use of intermediate tests to determine if there is a functional μLED die in every display pixel location to a defined display yield, which refers to the number of functional pixels in a display. Once 100% display yield has been reached, no further placement cycles are required. Alternatively, a high yield may be tolerated combined with a repair step. The industry standard display yield is currently 100% functional red, green and blue emitters, or (2) a probability model where a defined μLED die redundancy gives an acceptable probability of a defined display yield. That is, given variable factors, such as the quality of a semiconductor material and a number of emitters on a μLED die, a model may be used to predict the number of placement cycles required to achieve a high probability of a defined display yield.

In exemplary methods, an initial, or first, placement cycle comprises picking μLED dies from a first location on a wafer and a subsequent μLED die placement cycle comprises picking μLED dies from a separate, or second, location on the wafer or from a different wafer. This may provide the advantage that the transfer of clustered wafer or fabrication faults to the display is avoided. Appropriate algorithms can be implemented in the manufacturing method to implement this.

In exemplary methods, defective or excess μLED emitters in each display pixel may be 'disconnected' such that they are no longer illuminated when the display pixel or sub-pixel is illuminated. Multiple but different numbers of μLED emitters per pixel running in parallel may create unwanted image artefacts in the display. These may not be acceptable to users of the display. The disconnection of LEDs can be achieved using laser trimming or other such approaches. In exemplary methods, one or more electrical contacts of defective μLED dies may be passivated, thereby electrically insulating the electrode to 'disconnect' it.

In exemplary methods, one or more excess μLED emitters may remain 'connected' such that they are configured to act as a photosensitive device. That is, the excess μLED emitters may be configured to produce a current when light is incident on them. These devices may be termed μLED photodiodes. In such arrangements, stray light that is not directed by the structure of the μLED emitters in the display towards the emission surface may be incident on the μLED photodiodes and the resultant electrical current used to charge a battery of a device, or for some other purpose.

Exemplary methods and apparatus relate to using μLED dies comprising a plurality of μLED emitters, each of which may be configured to produce one of red, green or blue light to provide a sub-pixel of a display pixel of a display. A plurality of μLED emitters per die may reduce the number of placement cycles required to provide a defined display yield and may increase the probability of obtaining a functional inorganic μLED display.

Exemplary manufacturing methods use multiple placement cycles comprising, for example, picking, placing and/or testing of μLED dies and/or emitters. Such placement cycles may be used to pick, place and/or test multiple μLED dies per color per display pixel, wherein each μLED die comprises a plurality of μLED emitters to give higher display yields. The probability of there being a working μLED emitter in each sub-pixel of a display pixel is substantially increased using such methods and this may therefore lower numbers of defects and repairs.

Figure 8:
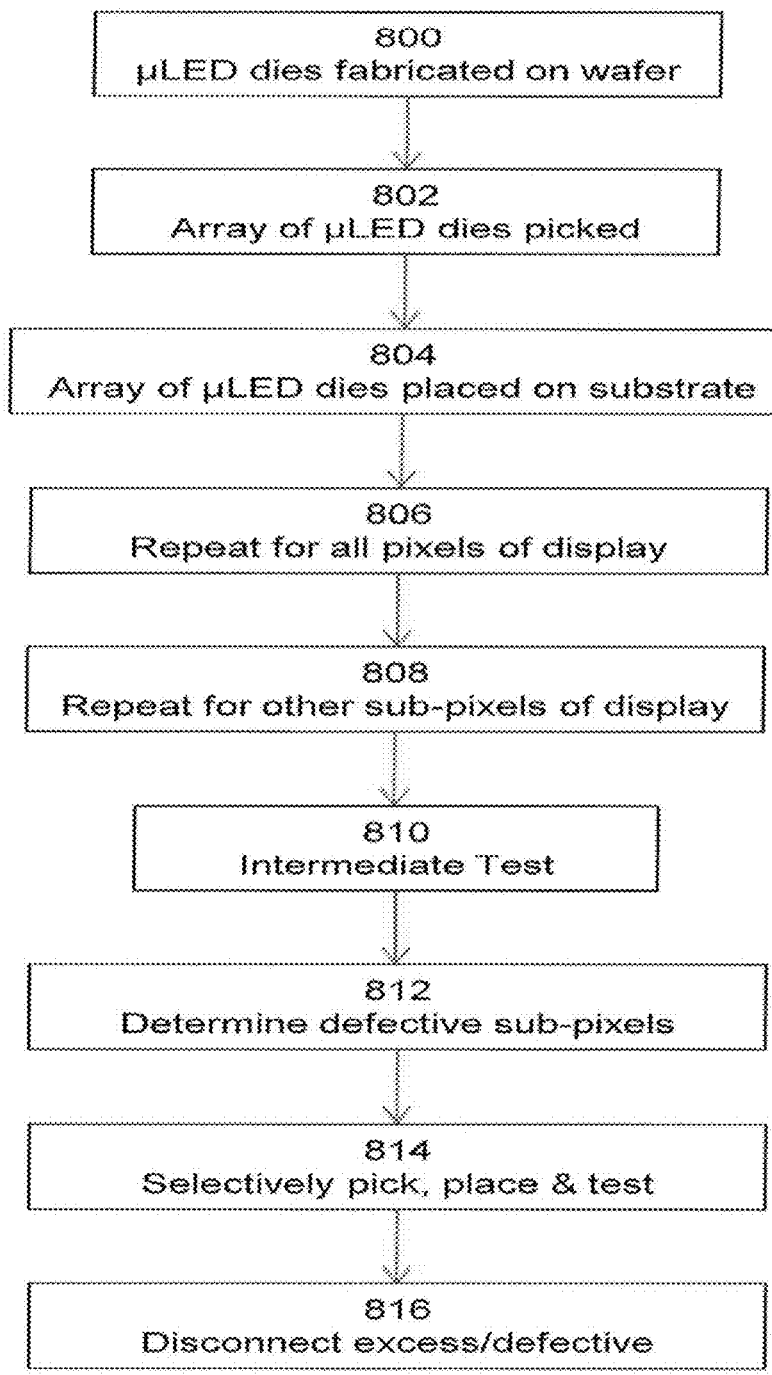
FIG. 8 is a flow diagram, in accordance with one embodiment.

FIG. 8 shows a flow diagram of an exemplary manufacturing method, a description of which is provided below. The method may involve a single assembly station that performs a plurality of placement cycles (e.g. pick, place & test) and may require no testing of μLED emitters or dies on the wafer.

As a first step, μLED dies are fabricated 800 on a semiconductor wafer. The μLED dies each comprise a plurality of μLED emitters of a single color. The color of the μLED emitters may be one of red, green or blue and may therefore be used to form a sub-pixel of a display pixel.

A PUT picks 802 an array of the μLED dies from the wafer. Each of the μLED dies in the array is configured to provide a sub-pixel of a display. The array of μLED dies is placed 804 on a TFT substrate and may form a matrix, for example, a square matrix, of μLED dies corresponding pixel locations on the display. The placement may begin at one corner of what will become a display. The process of picking and placing is then repeated 806 until all pixels of the display have a μLED die forming a sub-pixel of the pixel. When repeating the pick, the PUT may move the pick location on the wafer sequentially to a next μLED die and move the place location to a next matrix of pixels of the display, which may be adjacent to the first matrix of pixels in a chess board pattern. As mentioned above, the dies comprise a plurality of μLED emitters. The use of μLED emitters allows a plurality of emitters to be fabricated on a single die. Additionally, and as set out above, the electrical contacts or electrodes of each die may be on a single face of the die. That single face may be opposite a light emitting surface of the μLED emitters.

Once the method has repeated steps 802 and 804 until all pixels of the display comprise sub-pixel of one color (red, green or blue), steps 802-806 are repeated for the remaining two colors. The result of this is a display comprising a plurality of pixels, each pixel comprising a μLED die of each of red, blue and green. The μLED dies may each comprise a plurality of μLED emitters.

The μLED dies are tested 810 to determine whether they include at least one functional μLED emitter. The test may comprise all dies having a current applied to them in reverse bias and/or forward bias. This may be done for all sub-pixels of each pixel. It is then determined 812 whether any of the μLED dies are defective, i.e. do not contain a functional μLED emitter or has a parametric defect detected from the diode characteristics, and at which pixel locations. As exemplary μLED dies have their electrical contacts all on one side opposite the light emission surface, this enables the μLED dies to be powered for testing from the TFT layers immediately after placement.

Further pick, place and test cycles are completed 814 until the number of defective μLED dies (and therefore pixels) is less than a predetermined threshold. In each placement cycle a selectable PUT may be used to pick one or more μLED dies relating to the pixel locations where there is a μLED die comprising no working μLED emitter. However, in other methods, alternative methods of selecting μLED dies to be picked may be used. This method reduces the number of redundant μLED dies placed on the TFT layers and the number of placement cycles, both of which result in cost and time reductions.

Excess and/or defective μLED emitters may then be disconnected 816. This may be done by laser trimming to cut the tracks on any excess or defective emitters/dies to obtain one functional emitter per sub-pixel per pixel location. Passivation may also be used, as described above.

Optionally, the excess working emitters/dies can be configured for use as μLED photodiodes for energy harvesting, whereby these structures act like solar cells and the light energy reaching them is converted into electrical energy. The latter energy can then be used to charge the battery of the device or to drive other elements of a device.

It is noted that, as described above, the additional μLED dies picked in subsequent placement cycles after testing may be sourced from different locations of the same wafer or from different wafers.

Figure 9:
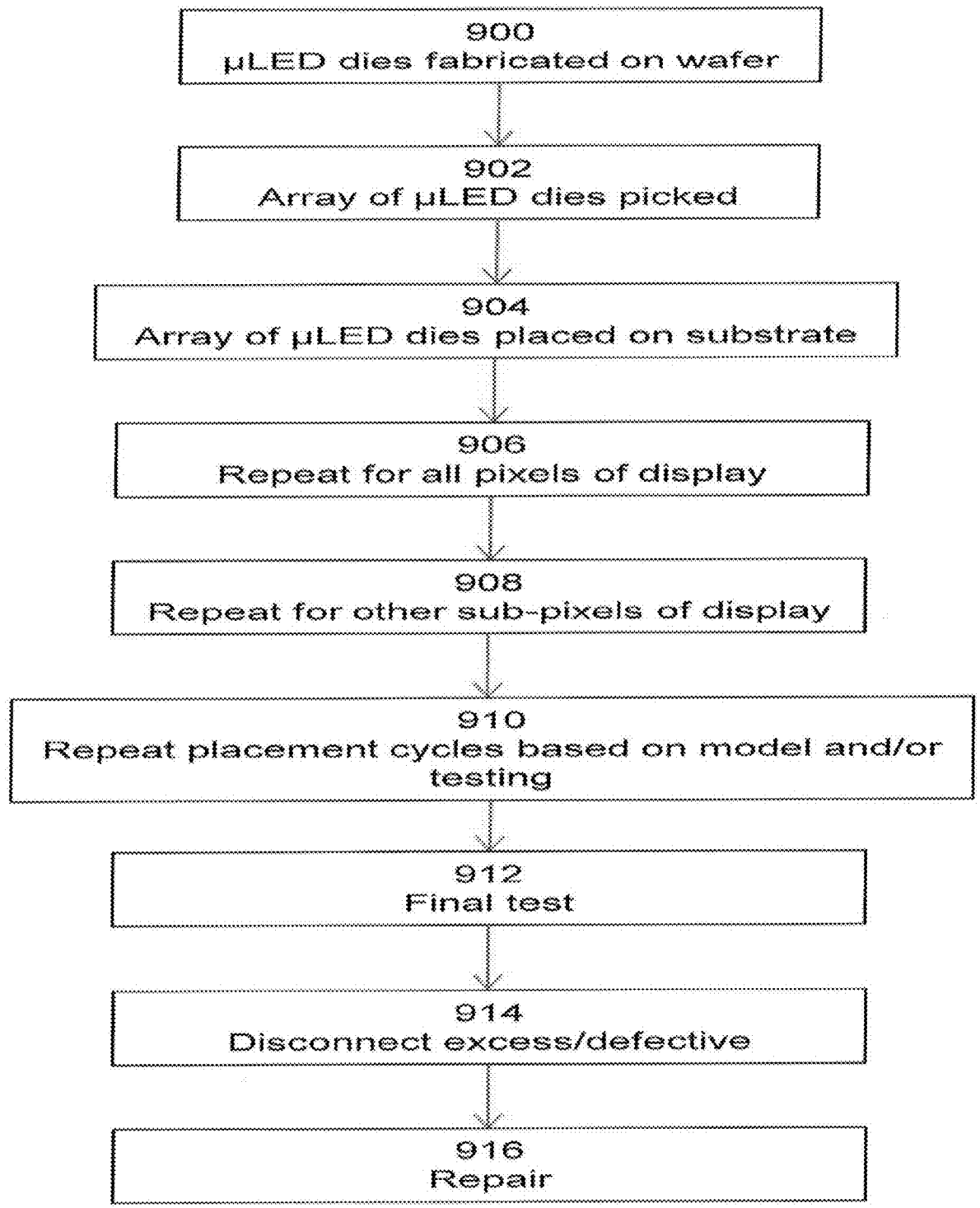
FIG. 9 is a flow diagram, in accordance with one embodiment.

FIG. 9 shows a further exemplary method that is described below. Again, there is no requirement for testing of μLED dies or emitters on the wafer. In addition, the method of FIG. 9 does not require a selective PUT.

As in the method of FIG. 8, after μLED dies have been fabricated 900 on a semiconductor wafer, multiple assembly and placement cycles 902-908 are undertaken to produce a display having at least one μLED die of each of red, green and blue at each pixel location. In the method of FIG. 9, the dies may comprise other types of emitter than μLED emitters, such as standard LED emitters. Further, the dies used may comprise a single emitter or a plurality of emitters.

After all sub-pixels of all pixels have been placed, there need be no intermediate testing phase, as in FIG. 8. Instead, steps 902-908 may be repeated one or more times. The number of times that steps 902-908 are repeated may be based on a model, as set out below. In other methods, a test may be undertaken after one or more placement cycles to determine whether the number of defective dies/emitters is below a threshold. If so, the method may be ended. If not, one or more further placement cycles may be undertaken. There is no selective replacement of the dies. Rather, a further die is placed at each pixel location of the display.

In some exemplary methods, a test may be undertaken on each sub-pixel color to determine whether the number of defective dies/emitters of that color is below a threshold. If so, no further dies of that color are added to the display in any subsequent placement cycles.

An effective final test is carried out before stack assembly functional test 912 (e.g. positive & reverse bias/AOI) is carried out to determine which LED dies are working. Defective and/or excess emitters are disconnected 914 using, for example, laser trimming to cut the tracks on those emitters/dies to obtain one functional emitter per colour per pixel location. Repair of the remaining defective emitters/dies is undertaken 916 at a repair station to singly add a good die to any pixel where there still is not a working emitter.

For example, a model may suggest that three placement cycles will be enough to give a high probability that the number of defective pixels (the display yield) will be below a threshold value. Therefore, steps 902-908 are repeated three times. A test 912 is then carried out and if the number of defective pixels is below the threshold, the excess and/or defective emitters are disconnected 914 and a repair of any remaining defective pixels is undertaken 916. If the test reveals that the number of defective pixels is above the threshold, steps 902-908 are repeated one or more times and the test 912 undertaken again.

The two exemplary manufacturing schemes is not an exhaustive list. Further schemes can be proposed within the scope of the appended claims.

Exemplary models distribute "killer" defects ranging from point (micro-defects) to larger cluster defects (macro-defects) across a wafer. The "killer" defects in this model do not distinguish between physical defects such as cracks, debris, craters which can be picked up by techniques such as AOI and parametric defects which are non-visible defects arising from electrical or optical parameters being out of specification. Cosmetic defects which do not affect the device performance are not considered in exemplary models. The macro and micro defects are randomly generated across a wafer surface area in the model. The model predicts the yield for various µLED designs (single and multiple emitters) and sizes. The model also takes into account the yield of the assembly process and/or assembly tool.

Figure 10:
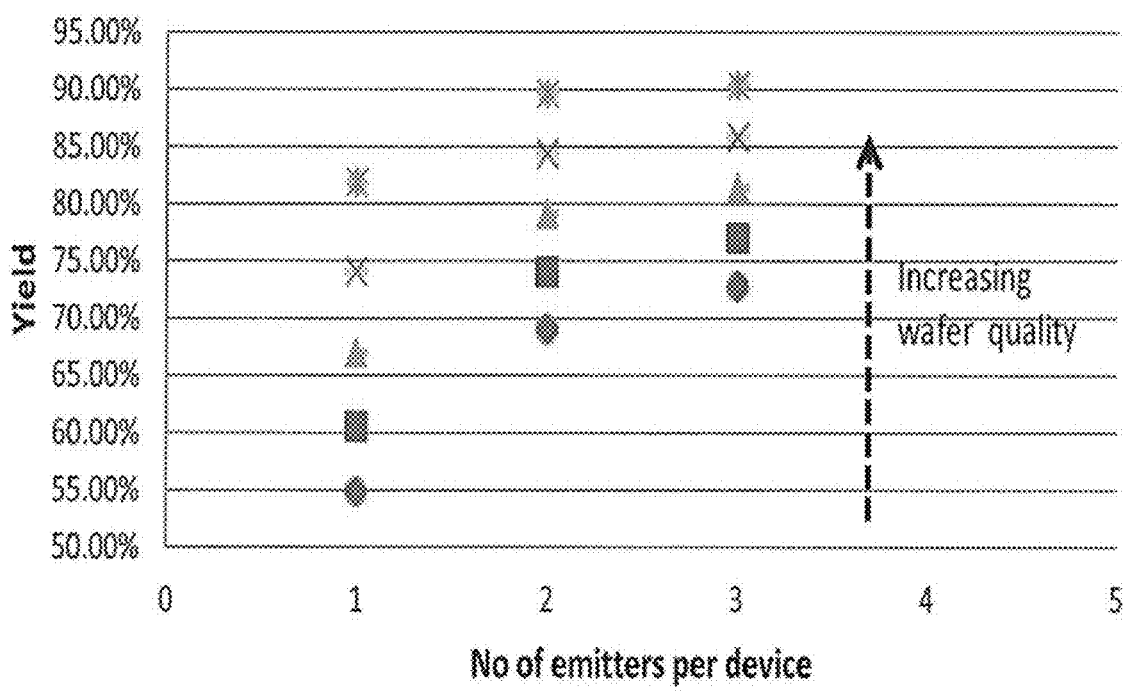
FIG. 10 is a plot of a number of emitters on a die against yield for a plurality of wafer qualities, in accordance with one embodiment.

One consequence of the proposed multi emitter µLED die is that the µLED die yield will increase as the number of emitters per LED die increases wherein a functional µLED die is defined as a µLED die with at least one functional µLED emitter. The results of the model are shown in FIG. 10, which is a plot of die yield against the number of emitters on a die for various wafer qualities. FIG. 10 shows that, in one embodiment the µLED die yield can increase from 60% to 77% as N (number of µLED emitters per µLED die) increases from 1 to 3.

Exemplary models run several placements cycles, emulating an exemplary manufacturing method, such as those described herein, and predicts the number of non-functional display pixel defects still remaining after each placement cycle.

Figure 11:
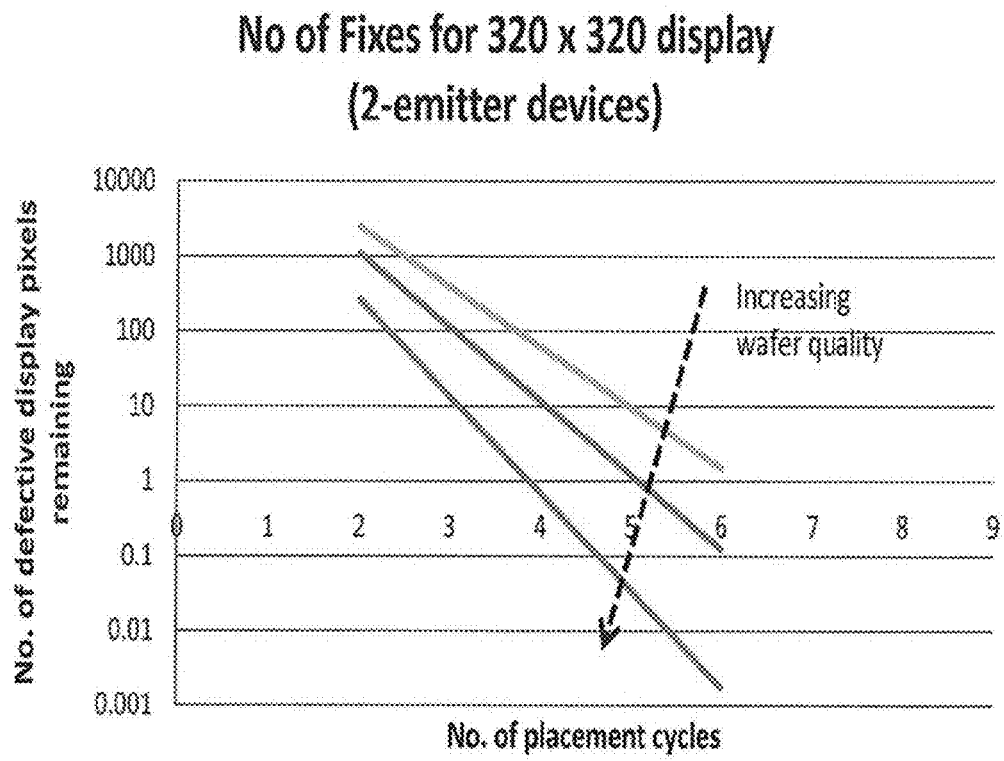
FIG. 11 is a plot of a number of placement cycles against a number of defective pixels for a plurality of wafer qualities, in accordance with one embodiment.

Exemplary models show how the number of defects can be reduced by placing multiple µLED dies at each pixel location. FIG. 11 shows a plot of the average number of defective pixels against the number of placement cycles in a method of manufacture. FIG. 11 relates to a specific embodiment of a wearable display (e.g. 320×320 pixels) and the use of multiple dies per pixel, each die comprising two µLED emitters. FIG. 11 shows that increasing the number of placement cycles can reduce the number of non-working display pixels to acceptable levels of below 1 pixel and approaching zero pixels. Such levels of defective pixels make any repair step shorter and more manageable within a cost and time effective method of display manufacture.

Figure 12:
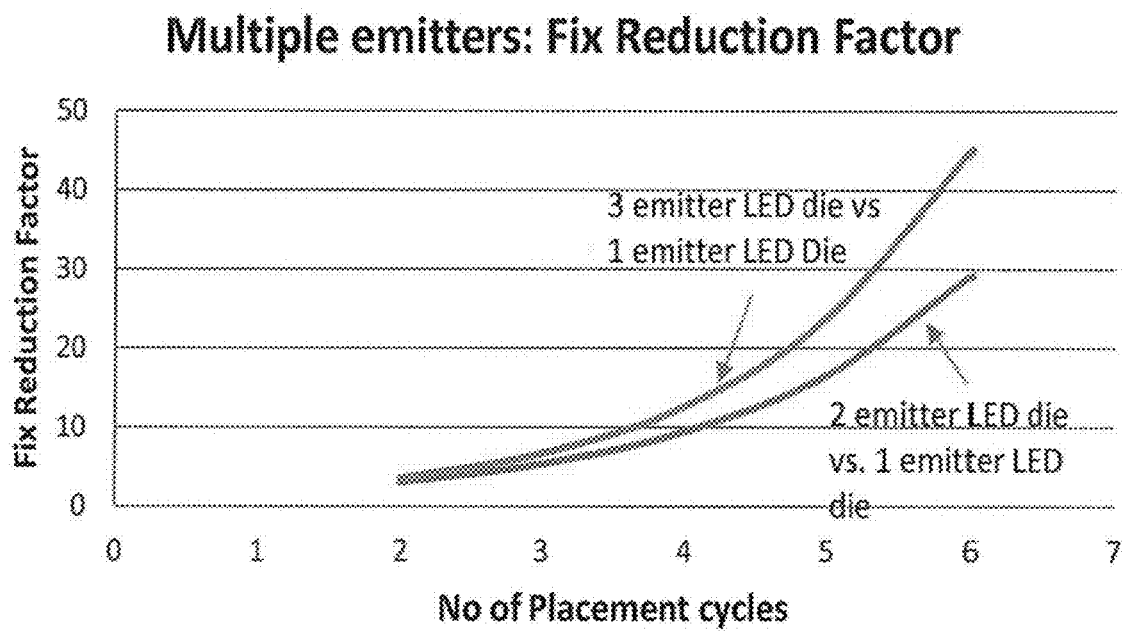
FIG. 12 is plot of a number of placement cycles against a fix reduction factor for a plurality of dies having different numbers of emitters, in accordance with one embodiment.

FIG. 12 shows how the number defective display pixels remaining in a multiple placement manufacturing flow can be reduced significantly by increasing the number of emitters per LED die. The data shows an improvement (fix reduction factor) from ~9× after two cycles to ~12× for a three emitter LED die after four pick and place cycles. The data also shows that a larger number of emitters per LED die can substantially reduce the number of remaining pixel defects (i.e. a 3 emitter LED die gives better results than a 2 emitter LED die).

A computer program may be configured to provide any of the above described methods. The computer program may be provided on a computer readable medium. The computer program may be a computer program product. The product may comprise a non-transitory computer usable storage medium. The computer program product may have computer-readable program code embodied in the medium that when executed by at least one processor, configures the processor to perform some or all of the methods.

Various methods and apparatus are described herein with reference to block diagrams or flowchart illustrations of computer-implemented methods, apparatus (systems and/or devices) and/or computer program products. It is understood that a block of the block diagrams and/or flowchart illustrations, and combinations of blocks in the block diagrams and/or flowchart illustrations, can be implemented by computer program instructions that are performed by one or more computer circuits. These computer program instructions may be provided to a processor circuit of a general purpose computer circuit, special purpose computer circuit, and/or other programmable data processing circuit to produce a machine, such that the instructions, which execute via the processor of the computer and/or other programmable data processing apparatus, transform and control transistors, values stored in memory locations, and other hardware components within such circuitry to implement the functions/acts specified in the block diagrams and/or flowchart block or blocks, and thereby create means (functionality) and/or structure for implementing the functions/acts specified in the block diagrams and/or flowchart block(s).

Computer program instructions may also be stored in a computer-readable medium that can direct a computer or other programmable data processing apparatus to function in a particular manner, such that the instructions stored in the computer readable medium produce an article of manufacture including instructions which implement the functions/acts specified in the block diagrams and/or flowchart block or blocks.

A tangible, non-transitory computer-readable medium may include an electronic, magnetic, optical, electromagnetic, or semiconductor data storage system, apparatus, or device. More specific examples of the computer-readable medium would include the following: a portable computer diskette, a random access memory (RAM) circuit, a read-only memory (ROM) circuit, an erasable programmable read-only memory (EPROM or Flash memory) circuit, a portable compact disc read-only memory (CD20 ROM), and a portable digital video disc read-only memory (DVD/Blu-ray).

The computer program instructions may also be loaded onto a computer and/or other programmable data processing apparatus to cause a series of operational steps to be performed on the computer and/or other programmable apparatus to produce a computer-implemented process such that the instructions which execute on the computer or other programmable apparatus provide steps for implementing the functions/acts specified in the block diagrams and/or flowchart block or blocks.

Accordingly, the invention may be embodied in hardware and/or in software (including firmware, resident software, micro-code, etc.) that runs on a processor, which may collectively be referred to as "circuitry," "a module," or variants thereof.

It should also be noted that in some alternate implementations, the functions/acts noted in the blocks may occur out of the order noted in the flowcharts. For example, two blocks shown in succession may in fact be executed substantially concurrently or the blocks may sometimes be executed in the reverse order, depending upon the functionality/acts involved. Moreover, the functionality of a given block of the flowcharts and/or block diagrams may be separated into multiple blocks and/or the functionality of two or more blocks of the flowcharts and/or block diagrams may be at least partially integrated. Finally, other blocks may be added/inserted between the blocks that are illustrated.

The foregoing description of the embodiments has been presented for the purpose of illustration; it is not intended to be exhaustive or to limit the patent rights to the precise forms disclosed. Persons skilled in the relevant art can appreciate that many modifications and variations are possible in light of the above disclosure.

The language used in the specification has been principally selected for readability and instructional purposes, and it may not have been selected to delineate or circumscribe the inventive subject matter. It is therefore intended that the scope of the patent rights be limited not by this detailed description, but rather by any claims that issue on an application based hereon. Accordingly, the disclosure of the embodiments is intended to be illustrative, but not limiting, of the scope of the patent rights, which is set forth in the following claims.

What is claimed is:

1. A display device, comprising:
   a substrate; and
   a plurality of light emitting diode (LED) dies attached to the substrate at locations corresponding to a sub-pixel of a pixel of the display device, the plurality of LED dies including a first LED die, comprising:
   a first LED emitter comprising:
   a parabolic mesa structure;
   a light emitting source within the parabolic mesa structure;
   a primary emission surface on a side of the LED die opposed to a top of the parabolic mesa structure; and
   a first electrode and a second electrode on a second side of the LED die opposed to the primary emission surface, the LED die including a plurality of LED emitters that share a common electrode.

2. The display device according to claim 1, wherein:
   the first LED die is attached to the substrate at a first location corresponding to a first sub-pixel of a pixel;
   the display device further includes a second LED die attached to the substrate at a second location corresponding to a second sub-pixel of the pixel; and
   the first LED die and the second LED die are configured to generate light having the same color.

3. The display device according to claim 2, wherein the first LED die is functional and the second LED die is non-functional.

4. The display device according to claim 1, wherein:
   the first LED die further includes:
   a second LED emitter comprising a second parabolic mesa structure and a second primary emission surface on the side of the first LED die opposed to a top of the second parabolic mesa structure; and
   a third electrode on the top of the second parabolic mesa structure;
   the first electrode is on the top of the parabolic mesa structure; and
   the second electrode is common to the LED emitter and the second LED emitter.

5. The display device according to claim 1, wherein the substrate includes a glass panel and thin-film-transistor (TFT) circuitry connected to the first and second electrodes of the first LED die.

6. The display device according to claim 1, wherein:
   the parabolic mesa structure includes a truncated top that defines the top of the parabolic mesa structure; and
   the first electrode is on the truncated top of the parabolic mesa structure.

7. The display device according to claim 1, further comprising a glass layer positioned to receive light from the primary emission surface.

8. The display device according to claim 1, wherein the first LED emitter includes a circular cross section including a diameter of less than 20 micrometers (μm).

9. The display device according to claim 1, wherein the first LED die includes an epitaxial layer shaped into the parabolic mesa structure;
   the first electrode is on the top of parabolic mesa structure; and
   the second electrode is on the epitaxial layer.

10. A display device, comprising:
    a substrate;
    a first light emitting diode (LED) die attached to the substrate, comprising:
    an LED emitter comprising:
    a parabolic mesa structure;
    a light emitting source within the parabolic mesa structure; and
    a primary emission surface on a side of the LED die opposed to a top of the parabolic mesa structure; and
    a first electrode and a second electrode on a second side of the LED die opposed to the primary emission surface, the LED die including a plurality of LED emitters that share a common electrode, the plurality of LED emitters of the LED die are attached to the substrate at a first location corresponding to a first sub-pixel of the pixel; and
    a second LED die including a second plurality of LED emitters attached to the substrate at a second location corresponding to a second sub-pixel of the pixel; the plurality of LED emitters and the second plurality of LED emitters are configured to generate light having the same color.

11. The display device according to claim 10, wherein the first LED die is functional and the second LED die is non-functional.

12. A light emitting diode (LED) die, comprising:
    a first LED emitter comprising:
    a parabolic mesa structure;
    a light emitting source within the parabolic mesa structure;
    a primary emission surface on a side of the LED die opposed to a top of the parabolic mesa structure; and
    a first electrode and a second electrode on a second side of the first LED die opposed to the primary emission surface, the first LED die including a plurality of LED emitters that share a common electrode; and
    a second LED emitter comprising:
    a second parabolic mesa structure;
    a second primary emission surface on the side of the LED die opposed to a top of the second parabolic mesa structure; and
    a third electrode on the top of the second parabolic mesa structure:
    wherein the first electrode is on the top of the parabolic mesa structure and the second electrode is common to the LED emitter and the second LED emitter.

13. The LED die according to claim 12, wherein the plurality of LED emitters are configured to generate light having the same color.

14. The LED die according to claim 12, wherein:
    the parabolic mesa structure includes a truncated top that defines the top of the parabolic mesa structure; and
    the first electrode is on the truncated top of the parabolic mesa structure.

15. The LED die according to claim 12, wherein the LED emitter includes a circular cross section including a diameter of less than 20 micrometers (μm).

16. The LED die according to claim 12, further comprising an epitaxial layer shaped into the parabolic mesa structure; and wherein:
    the first electrode is on the top of parabolic mesa structure; and
    the second electrode is on the epitaxial layer.

* * * * *

UNITED STATES PATENT AND TRADEMARK OFFICE
CERTIFICATE OF CORRECTION

| | |
|---|---|
| PATENT NO. | : 10,720,468 B2 |
| APPLICATION NO. | : 16/158237 |
| DATED | : July 21, 2020 |
| INVENTOR(S) | : Hughes et al. |

Page 1 of 1

It is certified that error appears in the above-identified patent and that said Letters Patent is hereby corrected as shown below:

In the Claims

In Column 18, in Claim 10, Line 21, delete "pixel;" and insert -- pixel, --, therefor.

Signed and Sealed this
Second Day of February, 2021

Drew Hirshfeld
*Performing the Functions and Duties of the
Under Secretary of Commerce for Intellectual Property and
Director of the United States Patent and Trademark Office*